US009287357B2

(12) United States Patent
Rodder et al.

(10) Patent No.: US 9,287,357 B2
(45) Date of Patent: Mar. 15, 2016

(54) INTEGRATED CIRCUITS WITH SI AND NON-SI NANOSHEET FET CO-INTEGRATION WITH LOW BAND-TO-BAND TUNNELING AND METHODS OF FABRICATING THE SAME

(71) Applicant: Samsung Electronics Co., Ltd., Suwon-si, Gyeonggi-do (KR)

(72) Inventors: Mark S. Rodder, Dallas, TX (US); Borna Obradovic, Leander, TX (US); Rwik Sengupta, Austin, TX (US); Dharmendar Reddy Palle, Austin, TX (US); Robert C. Bowen, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/737,048

(22) Filed: Jun. 11, 2015

(65) Prior Publication Data

US 2015/0364542 A1 Dec. 17, 2015

Related U.S. Application Data

(60) Provisional application No. 62/012,548, filed on Jun. 16, 2014.

(51) Int. Cl.
*H01L 29/06* (2006.01)
*H01L 29/20* (2006.01)
*H01L 27/092* (2006.01)
*B82Y 10/00* (2011.01)

(52) U.S. Cl.
CPC ........ *H01L 29/0665* (2013.01); *H01L 27/0922* (2013.01); *H01L 29/20* (2013.01); *B82Y 10/00* (2013.01); *Y10S 977/755* (2013.01)

(58) Field of Classification Search
None
See application file for complete search history.

(56) References Cited

U.S. PATENT DOCUMENTS

| | | | |
|---|---|---|---|
| 7,812,342 B2 | 10/2010 | Lee et al. | |
| 8,183,104 B2 | 5/2012 | Hobbs et al. | |
| 8,422,273 B2 | 4/2013 | Chang et al. | |
| 8,513,125 B2 | 8/2013 | Saracco et al. | |
| 8,665,013 B2 | 3/2014 | Saunders | |
| 2006/0284218 A1 | 12/2006 | Kaner et al. | |
| 2012/0199814 A1 | 8/2012 | Berger | |

*Primary Examiner* — Scott B Geyer
(74) *Attorney, Agent, or Firm* — Myers Bigel & Sibley, P.A.

(57) ABSTRACT

An integrated circuit may include multiple first, non-Si, nanosheet field-effect transistors (FETs) and multiple second, Si, nanosheet FETs. Nanosheets of ones of the first, non-Si, nanosheet FETs may include less than about 30% Si. The first, non-Si, nanosheet FETs may define a critical speed path of the circuit of the integrated circuit. Nanosheets of ones of the second, Si, nanosheet FETs may include more than about 30% Si. The second, Si, nanosheet FETs may define a non-critical speed path of the integrated circuit. Ones of the first, non-Si, nanosheet FETs may be configured to have a higher speed than a speed of ones of the second, Si, nanosheet FETs.

20 Claims, 10 Drawing Sheets

INTEGRATED CIRCUITS WITH SI AND NON-SI NANOSHEET FET CO-INTEGRATION WITH LOW BAND-TO-BAND TUNNELING AND METHODS OF FABRICATING THE SAME

CROSS-REFERENCE TO RELATED APPLICATION

This application claims priority under 35 U.S.C. §120 to U.S. Provisional Application Ser. No. 62/012,548, entitled SI AND NON-SI NANOSHEET FET CO-INTEGRATION WITH LOW BAND-TO-BAND TUNNELING FOR LOW POWER AND HIGH PERFORMANCE CHIPS, filed in the USPTO on Jun. 16, 2014, the disclosure of which is incorporated herein by reference in its entirety.

FIELD

Some embodiments of the inventive concept relate generally to integrated circuits and, more particularly, to integrated circuits with co-integration of Si and non-Si nanosheet field effect transistors (FETs) and methods of forming the same.

BACKGROUND

As the size of integrated circuits decreases, it has become desirable to increase the density of the arrangement of FET devices on a substrate. Vertical fin-based field-effect transistor (finFET) devices have been developed that include multiple vertical fins serving as conducting channel regions to enable larger effective conduction width in a small layout area overlying a substrate. However, as circuits are scaled to smaller dimensions and thus a smaller area, the lateral spacing between adjacent vertical fins may become too small to enable the vertical finFET devices to operate properly. Stacked nanosheet FETs have been developed to further enable larger effective conduction width in a small layout area overlying a substrate. A stacked nanosheet FET may include multiple nanosheets arranged in a three dimensional array on a substrate with a gate stack formed on a channel region of ones of the nanosheets. The gate stack may surround four sides of the channel region of a nanosheet (gate-all-around).

SUMMARY

According to some embodiments of the inventive concept, integrated circuits are provided. An integrated circuit may include a plurality of first, non-Si, nanosheet field-effect transistors (FETs) and a plurality of second, Si, nanosheet FETs. Nanosheets of ones of the first, non-Si, nanosheet FETs may include less than about 30% Si. The plurality of first, non-Si, nanosheet FETs may define a critical speed path. Nanosheets of ones of the second, Si, nanosheet FETs may include more than about 30% Si. The plurality of second, Si, nanosheet FETs may define a non-critical speed path. Ones of the first, non-Si, nanosheet FETs may be configured to have a higher speed than a speed of ones of the second, Si, nanosheet FETs.

Ones of the first, non-Si, nanosheet FETs may include a barrier height from source to channel below a threshold value that is sufficient to limit the band-to-band tunneling induced current to substantially less than the conventional sub-threshold leakage current, such that the total leakage current has no significant contribution from band-to-band tunneling induced current.

A thickness of nanosheets of ones of the first, non-Si, nanosheet FETs may be greater than a critical thickness of the nanosheets of the ones of the first, non-Si, nanosheet FETs.

The integrated circuit may include a plurality of third, non-Si, nanosheet FETs in the non-critical speed path. Nanosheets of ones of the third, non-Si, nanosheet FETs may include less than about 30% Si. Ones of the second, Si, nanosheet FETs may include a first front-end-of-line (FEOL) capacitance that may be less than 50% of a total capacitance of the ones of the second, Si, plurality of nanosheet FETs. Ones of the third, non-Si, nanosheet FETs may include a FEOL capacitance that may be greater than 50% of a total capacitance of the ones of the third, non-Si, nanosheet FETs.

The nanosheets of the ones of the third, non-Si, nanosheet FETs may include more than about 70% Ge. The ones of the third, non-Si, nanosheet FETs may include gates that surround three sides of portions of respective nanosheets of the ones of the third, non-Si, plurality of nanosheets.

The nanosheets of the ones of the third, non-Si, nanosheet FETs may include inner surfaces between horizontally adjacent ones of the nanosheets of the ones of the third, non-Si, nanosheet FETs. The ones of the third, non-Si, nanosheet FETs further may include respective dielectric interfaces on the inner surfaces of the nanosheets of the ones of the third, non-Si, nanosheet FETs.

The nanosheets of the ones of the third, non-Si, nanosheet FETs may include InGaAs. A thickness of the nanosheets of the ones of the third, non-Si, nanosheet FETs may be less than a critical thickness of a composition of the nanosheets of the ones of the third, non-Si, nanosheet FETs.

A first ratio of a leakage current to an effective channel conduction width of the ones of the first, non-Si, nanosheet FETs may be greater than a second ratio of a leakage current to an effective channel conduction width of the ones of the second, Si, nanosheet FETs.

The first ratio of the leakage current per the effective channel conduction width of the ones of the first, non-Si, nanosheet FETs may be greater than double of the second ratio of the leakage current per the effective channel conduction width of the ones of the second, Si, nanosheet FETs.

The first ratio of the leakage current per the effective channel conduction width of the ones of the first, non-Si, nanosheet FETs may be greater than five times the second ratio of the leakage current per the effective channel conduction width of the ones of the second, Si, nanosheet FETs.

A first effective drive current, $I_{\it eff}$, of the ones of the first, non-Si, nanosheet FETs may be less than a second effective drive current of the ones of the second, Si, nanosheet FETs.

A first effective channel conduction width of the ones of the first, non-Si, nanosheets FETs may be less than a second effective channel conduction width of the ones of the second, Si, nanosheet FETs.

The ones of the first, non-Si, nanosheet FETs may include a first quantity of nanosheets per FET and wherein the ones of the second, Si, nanosheet FETs may include a second quantity of nanosheets per FET that may be greater than the first quantity of nanosheets per FET.

The nanosheets of the ones of the first, non-Si, nanosheet FETs may include a first width. The nanosheets of the ones of the second, Si, nanosheet FETs may include a second width that may be greater than the first width.

The ones of the first, non-Si, nanosheet FETs may include a first threshold voltage, $V_T$. The ones of the second, Si, nanosheet FETs may include a second threshold voltage that may be greater than the first threshold voltage.

The plurality of first, non-Si, nanosheet FETs may include a plurality of n-type FETs and a respective plurality of p-type FETs to provide a plurality of complementary pairs of nanosheet FETs. Ones of the plurality of n-type FETs may include a first quantity of horizontal layers of nanosheets. The nanosheets of ones of the plurality of n-type FETs may include a Group III-V semiconductor. Ones of the plurality of p-type FETs may include a second quantity of horizontal layers of nanosheets. The nanosheets of ones of the plurality of p-type FETs may include more than about 70% Ge. Ones of the second, Si, nanosheet FETs may include a third quantity of horizontal layers of nanosheets. The third quantity may be greater than the first quantity and may be greater than the second quantity.

The plurality of first, non-Si, nanosheet FETs may include a plurality of n-type FETs and a plurality of p-type FETs. The nanosheets of ones of the plurality of n-type FETs may include InGaAs. The nanosheets of ones of the plurality of p-type FETs may include more than about 70% Ge.

The plurality of second, Si, nanosheet FETs may include a plurality of n-type FETs and a plurality of p-type FETs. A surface orientation of top and bottom surfaces of the nanosheets of ones of the plurality of n-type FETs may be (100). A surface orientation of top and bottom surfaces of the nanosheets of ones of the plurality of p-type nanosheet FETs may be (110).

The nanosheets of the ones of the first, non-Si, nanosheet FETs may include more than about 70% Ge. The plurality of first, non-Si, nanosheet FETs may include a plurality of n-type FETs and a plurality of p-type FETs. A surface orientation of top and bottom surfaces of the nanosheets of ones of the plurality of n-type FETs may be (111). A surface orientation of top and bottom surfaces of the nanosheets of ones of the plurality of p-type nanosheet FETs may be (110).

A first thickness of a first subset of the plurality of first, non-Si, nanosheet FETs may be different from a second thickness of a second subset of the plurality of first, non-Si, nanosheet FETs. A difference between the first thickness and the second thickness may be sufficiently large to affect a threshold voltage, $V_T$, a carrier mobility, and an effective drive current of the first, non-Si, plurality of nanosheet FETs.

According to other embodiments of the inventive concept, methods of forming integrated circuits are provided. A method may include depositing a plurality of layers of a first channel material interspersed by respective layers of sacrificial material on a first region of a substrate of an integrated circuit. The first channel material may include less than about 30% Si. The method may include depositing a plurality of layers of a second channel material interspersed by respective layers of sacrificial material on a second region of the substrate of the integrated circuit. The second channel material may include more than about 30% Si. The method may include masking and etching the plurality of layers of the first channel material and the plurality of layers of second channel material to define a plurality of layers of first nanosheets and a plurality of layers of second nanosheets. The method may include forming a first plurality of dummy gates surrounding portions of the plurality of first nanosheets. The method may include forming a second plurality of dummy gates surrounding portions of the plurality of second nanosheets. The method may include forming spacers on ones of the first plurality of dummy gates and on ones of the second plurality of dummy gates. The method may include depositing dielectric material along ends of ones of the plurality of first nanosheets and along ends of ones of the plurality of second nanosheets. The method may include removing the dummy gates. The method may include removing the sacrificial material. The method may include depositing a first gate stack surrounding the portions of the plurality of first nanosheets. The method may include depositing a second gate stack surrounding the portions of the plurality of second nanosheets. The method may include completing the formation of the integrated circuit.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1A:
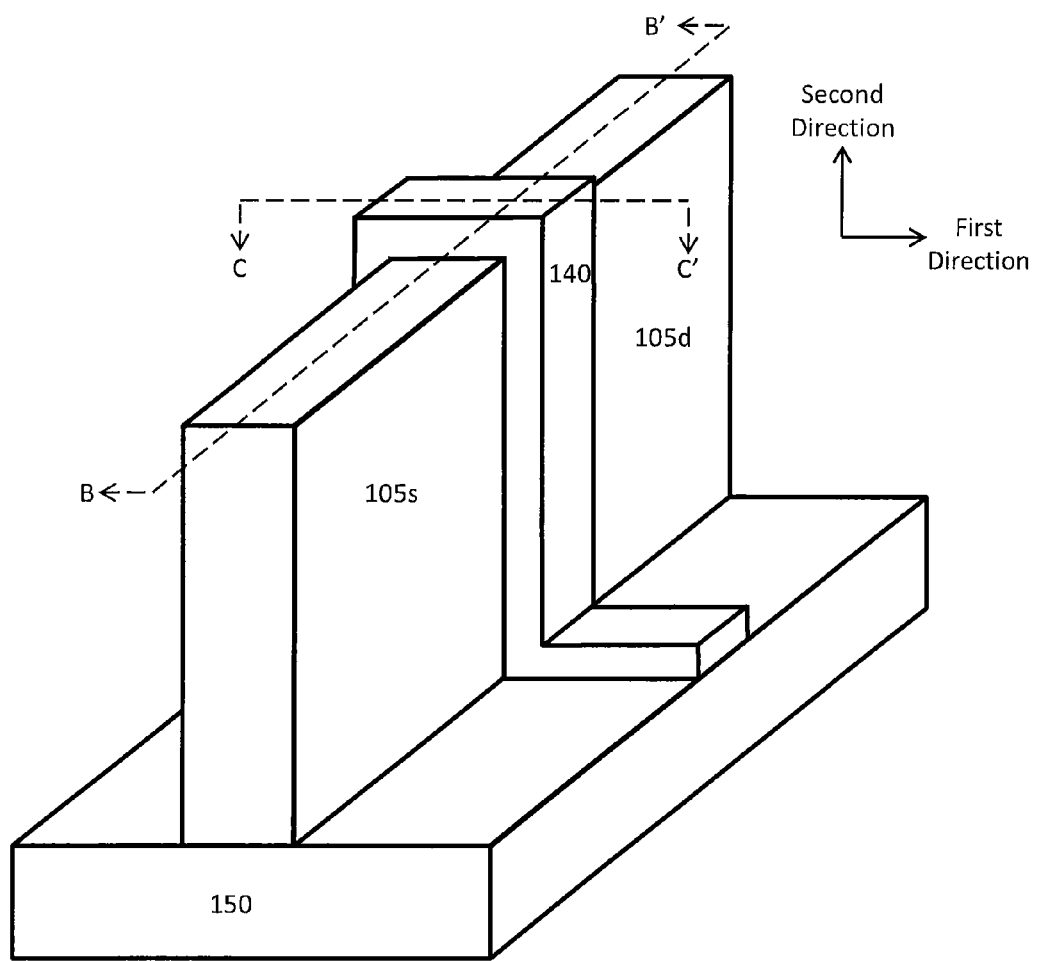
FIG. 1A is a prospective view schematically illustrating a nanosheet FET according to some embodiments of the inventive concept.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

As used herein, the term integrated circuit may refer to a semiconductor device and/or a circuit including one or more electrical circuits and/or components thereof.

Figure 1B:
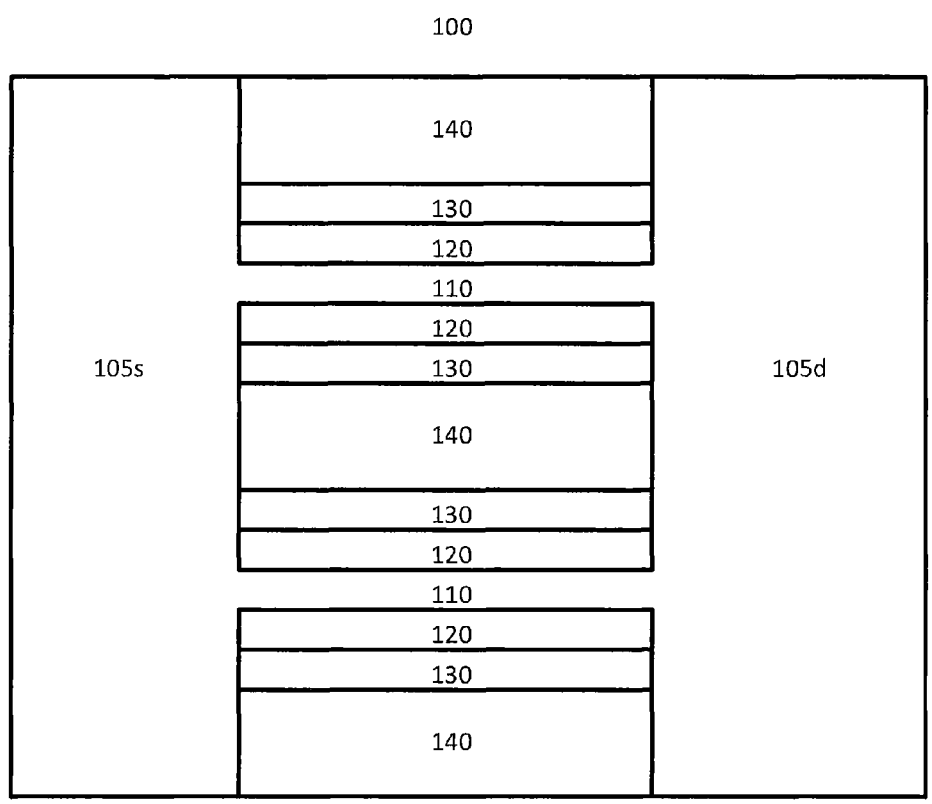
FIG. 1B is a cross-sectional view taken along the line B-B' of FIG. 1A.
Figure 1C:
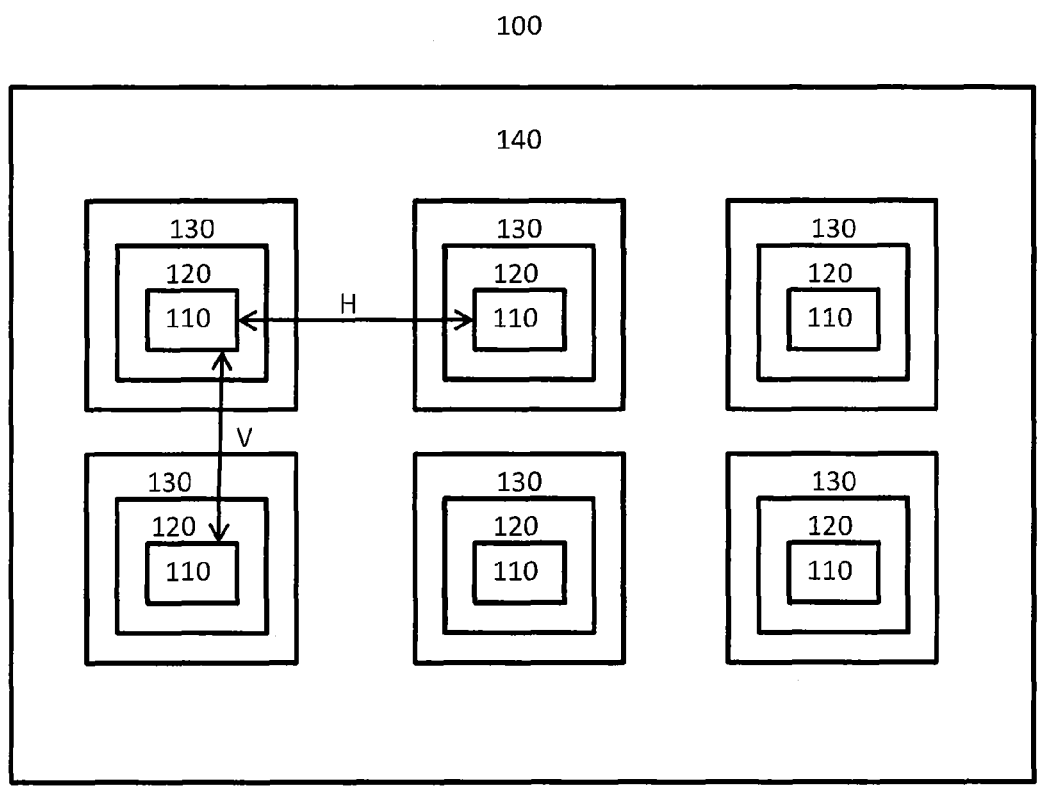
FIG. 1C is a cross-sectional view taken along the line C-C' of FIG. 1A.

Reference is now made to FIGS. 1A, 1B, and 1C, which are a prospective view schematically illustrating a nanosheet FET, a cross-sectional view taken along the line B-B' of FIG. 1A, and a cross-sectional view taken along the line C-C' of FIG. 1A, respectfully, according to some embodiments of the inventive concept. In some embodiments, a stacked nanosheet FET 100 may be formed on a substrate 150. In some embodiments, the substrate 150 may be an insulating substrate 150. The stacked nanosheet FET 100 may include a plurality of vertically stacked channel patterns. Ones of the channel patterns may comprise a plurality of nanosheets 110 arranged in a horizontal plane that is parallel to a surface of the substrate 150. The plurality of stacked channel patterns may perform a function of a channel of the stacked nanosheet FET 100. In other words, the plurality of nanosheets 110 may perform the function of the channel of the stacked nanosheet FET 100. In some embodiments, the channel of the stacked nanosheet FET 100 may be substantially unstressed. For example, a channel stress of the stacked nanosheet FET may be less than about 1 GPa.

Although two vertically stacked channel patterns are illustrated in FIGS. 1B and 1C, more vertically stacked channel patterns may be provided. For example, in some embodiments, the plurality of vertically stacked channel patterns may include three or more vertically stacked channel patterns. Although each of the vertically stacked channel patterns illustrated in FIGS. 1B and 1C include three nanosheets 110, a different number of nanosheets 110 may be provided. For example, in some embodiments, ones of the plurality of vertically stacked channel patterns may include three or more nanosheets 110. In some embodiments, ones of the plurality of vertically stacked channel patterns may include two nanosheets 110.

In some embodiments, a width of ones of the plurality of nanosheets 110 may be in a range of about 10 nm to about 30 nm in a first direction that is parallel to the surface of the substrate 150. In some embodiments, a thickness of ones of the plurality of nanosheets may be in a range of about 2 nm to about 8 nm in a second direction that is perpendicular to the surface of the substrate 150. In some embodiments, a thickness of ones of the plurality of nanosheets may be in a range of about 3 nm to about 6 nm in the second direction that is perpendicular to the surface of the substrate 150.

Ones of the plurality of nanosheets 110 in a horizontal plane may be spaced apart from each other in the first direction that is parallel to the surface of the substrate 150 at a horizontal spacing distance H between adjacent ones of the plurality of nanosheets 110. Ones of the plurality of vertically stacked channel patterns may be spaced apart from each other in the second direction that is perpendicular to the surface of the substrate 150 at a vertical spacing distance V between adjacent ones of the plurality of vertically stacked channel patterns. In other words, ones of the plurality of nanosheets 110 of a first channel pattern may be spaced apart from respective ones of the plurality of nanosheets 110 of an adjacent second channel pattern in the second direction at the vertical spacing distance V. In some embodiments, ones of the plurality of nanosheets 110 of the first channel pattern may be aligned with the respective ones of the plurality of nanosheets 110 of the adjacent second channel pattern in the second direction, but the inventive concept is not limited thereto. In some embodiments, the first channel pattern may have a different number of nanosheets 110 than the adjacent second channel pattern and/or the ones of the plurality of nanosheets 110 of the first channel pattern may have a different thickness than the ones of the plurality of nanosheets 110 of the adjacent second channel pattern.

The stacked nanosheet FET 100 may include a gate stack surrounding portions of the plurality of vertically stacked channel patterns. The gate stack may perform a function of a gate of the stacked nanosheet FET 100. The gate stack may include a gate dielectric material 120 surrounding portions of ones of the plurality of nanosheets 110 of the plurality of vertically stacked channel patterns. For example, the gate dielectric material 120 may surround top, bottom, and/or sidewall surfaces of ones of the plurality of nanosheets 110 of the plurality of vertically stacked channel patterns. The gate dielectric material 120 may electrically insulate the plurality of nanosheets 110 from electrically conductive portions of the gate stack.

The gate stack may include a low resistance gate metal layer 140 surrounding portions of the plurality of vertically stacked channel patterns. The low resistance gate metal layer 140 may extend on the gate dielectric material 120 between adjacent ones of the plurality of vertically stacked channel patterns. The low resistance gate metal layer 140 may surround top and bottom surfaces of portions of ones of the plurality of vertically stacked channel patterns. In other words, the low resistance gate metal layer 140 may surround top and bottom surfaces of portions of ones of the plurality of nanosheets 110 of the ones of the plurality of vertically stacked channel patterns. The low resistance gate metal layer 140 may further surround outer edges of outer ones of the ones of the plurality of nanosheets 110 of the ones of the plurality of vertically stacked channel patterns. In some embodiments, the low resistance gate metal layer 140 may extend between horizontally adjacent ones of the plurality of nanosheets 110, but the inventive concept is not limited thereto. In some embodiments, the gate dielectric material 120 may electrically insulate the plurality of nanosheets 110 from the low resistance gate metal layer 140.

In some embodiments, the gate stack may include a work function tuning metal layer 130 between the low resistance gate metal layer 140 and the gate dielectric material 120, but the inventive concept is not limited thereto. For example, in some embodiments, the gate stack may not include a work function tuning metal layer 130. The work function tuning metal layer 130 may extend between adjacent ones of the plurality of vertically stacked channel patterns. In some embodiments, the work function tuning metal layer 130 may extend between horizontally adjacent ones of the plurality of nanosheets 110, but the inventive concept is not limited thereto. The work function tuning metal layer 130 may control a work function of the stacked nanosheet FET 100. In some embodiments, the gate dielectric material 120 may electrically insulate the plurality of nanosheets 110 from the low resistance gate metal layer 140 and/or the work function tuning metal layer 130.

The stacked nanosheet FET 100 may include a source region 105s and a drain region 105d on opposing ends of the plurality of vertically stacked channel patterns. The source region 105s and the drain region 105d may be connected to respective ends of ones of the plurality of vertically stacked channel patterns. In other words, the source region 105s and the drain region 105d may be connected to respective ends of ones of the plurality of nanosheets 110 of the ones of the plurality of vertically stacked channel patterns. The source region 105s may perform a function of a source of the stacked nanosheet FET 100. The drain region 105d may perform a function of a drain of the stacked nanosheet FET 100.

In some embodiments, the stacked nanosheet FET 100 may include an n-type FET and/or a p-type FET. In some embodiments, an integrated circuit may include more than one stacked nanosheet FET. For example, in some embodiments, the integrated circuit may include an n-type stacked nanosheet FET and a p-type stacked nanosheet FET. The n-type stacked nanosheet FET and/or the p-type stacked nanosheet FET may be a stacked nanosheet FET as described with regard to FIGS. 1A-1C, or other embodiments of the inventive concept. In some embodiments, the integrated circuit may include a plurality of n-type stacked nanosheet FETs and a plurality of p-type stacked nanosheet FETs.

Ones of the nanosheets 110 may include a thin layer of conducting channel material. For example, in some embodiments, ones of the nanosheets 110 may include Si, SiGe, Ge, and/or a Group III-V semiconductor material, for example InGaAs, but the inventive concept is not limited thereto. The term "Si nanosheet FET" will refer to nanosheet FETs with nanosheets including Si or including a large percentage of Si, for example $Si_xGe_{1-x}$, where x is greater than about 0.3. The term "non-Si nanosheet FET" will refer to nanosheet FETs with nanosheets not including Si, for example InGaAs, or including a small percentage of Si, for example $Si_yGe_{1-y}$, where y is less than about 0.3.

A non-Si nanosheet FET may have a higher channel carrier mobility than an equivalent Si nanosheet FET. The higher channel carrier mobility may result in higher performance. However, the non-Si nanosheet FET may also have higher band-to-band tunneling (BTBT) leakage current than the equivalent Si nanosheet FET. In general, high BTBT leakage current may occur in the same device design range as high channel carrier mobility.

In some embodiments, a performance of a FET may correspond to a maximum speed of the FET. For example, the performance of the FET may correspond to a maximum operable frequency of the FET. For example, the performance of the FET may correspond to a maximum cut-off frequency, $f_T$; however, embodiments of the invention are not limited thereto.

Several factors may induce higher BTBT leakage current in a non-Si nanosheet FET. For example, a parasitic-bipolar-effect (PBE) may effectively multiply a BTBT leakage current by a large value for non-Si nanosheet FETs with nanosheets including $Si_yGe_{1-y}$, where y is less than about 0.3, to result in a net BTBT-induced leakage current that is significantly high. For example, PBE may effectively multiply a BTBT leakage current by a value greater than 100. This PBE effect may be mitigated for SiGe-on-insulator fin-based FETs (SiGeOI finFETs) where a bottom portion of the channel of the SiGeOI finFET is not gated and may be available for carrier recombination and reduction or elimination of the PBE. However, non-Si nanosheet FETs with nanosheets including $Si_yGe_{1-y}$, where y is less than about 0.3, that utilize a gate-all-around (GAA) structure, may not include an un-gated interface to mitigate PBE.

Non-Si nanosheet FETs with nanosheets including InGaAs may not be significantly affected by PBE but may have high BTBT leakage current unless the InGaAs nanosheet thickness is sufficiently thin. However, for thinner InGaAs nanosheets, while BTBT leakage current may be mitigated, carrier mobility and performance may be decreased.

Si nanosheet FETs and non-Si nanosheet FETs may be co-integrated in an integrated circuit to provide an integrated circuit with both high performance and low power. The co-integrated integrated circuit may utilize the high mobility of the non-Si materials while mitigating the high BTBT leakage current of the non-Si materials.

Figure 2:
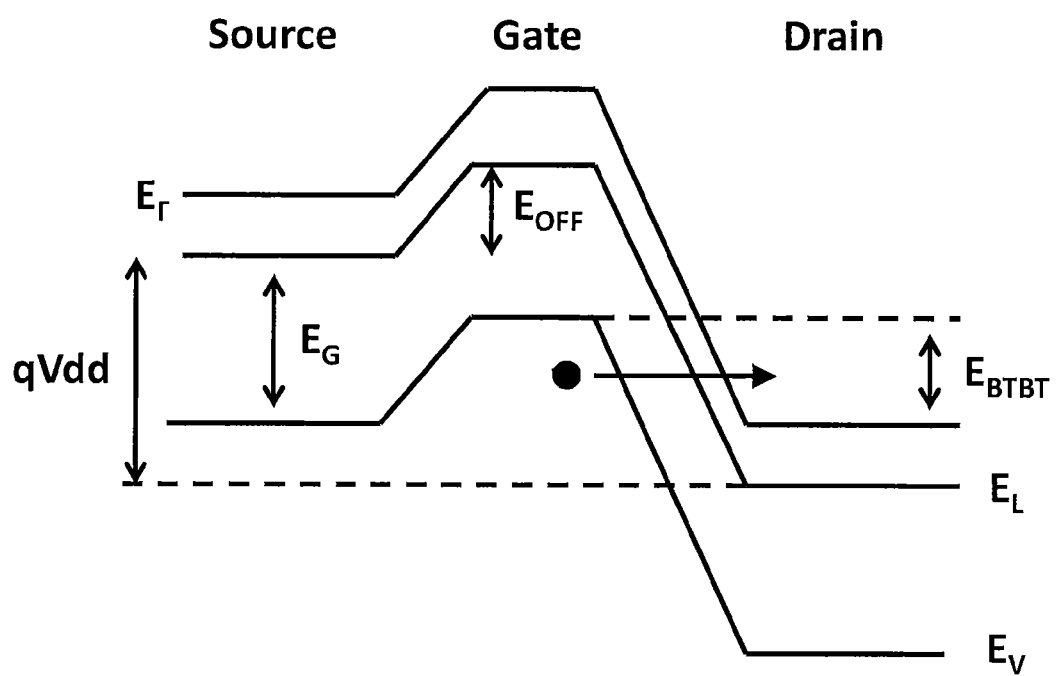
FIG. 2 is an energy band diagram illustrating a relation between electron energy levels and position within a nanosheet FET according to some embodiments of the inventive concept.

Reference is now made to FIG. 2, which is an energy band diagram illustrating a relation between electron energy levels and position within a nanosheet FET according to some embodiments of the inventive concept. While a transistor is in an off state, an electron may tunnel across a band gap from a valence band at the gate to a conduction band at the drain to produce BTBT leakage current. A magnitude of the source-channel barrier, $E_{OFF}$, may modulate the tunneling window $E_{BTBT}$, which in turn may control the BTBT leakage current, as shown in Eqn. 1:

$$E_{BTBT} \approx qVdd + E_{OFF} - E_G - (E_\Gamma - E_L) \qquad \text{Eqn. 1:}$$

As shown in Eqn. 1, an electron energy band, $E_{BTBT}$, at which an electron may tunnel across a band gap from a valence band at the gate to a conduction band at the drain to produce BTBT leakage current may be affected by qVdd, an energy of the source-channel barrier ($E_{OFF}$), $E_G$, $E_\Gamma$, and $E_L$. In Eqn. 1, Vdd is the operating voltage of the device (q is the electron charge), Eoff is the source-channel electrostatic barrier height under off conditions, Eg is the bandgap, while $E_\Gamma$ and $E_L$ are the conduction band energies at the Γ and L points in k-space, respectively. A BTBT leakage current of a transistor may be proportional to the $E_{BTBT}$ of the transistor. Therefore, according to some embodiments of the inventive concept, BTBT leakage current may be limited in a co-integrated integrated circuit by utilizing the non-Si nanosheet FETs in portions of the integrated circuit that allow for a FET with a low source-channel barrier.

Figure 3:
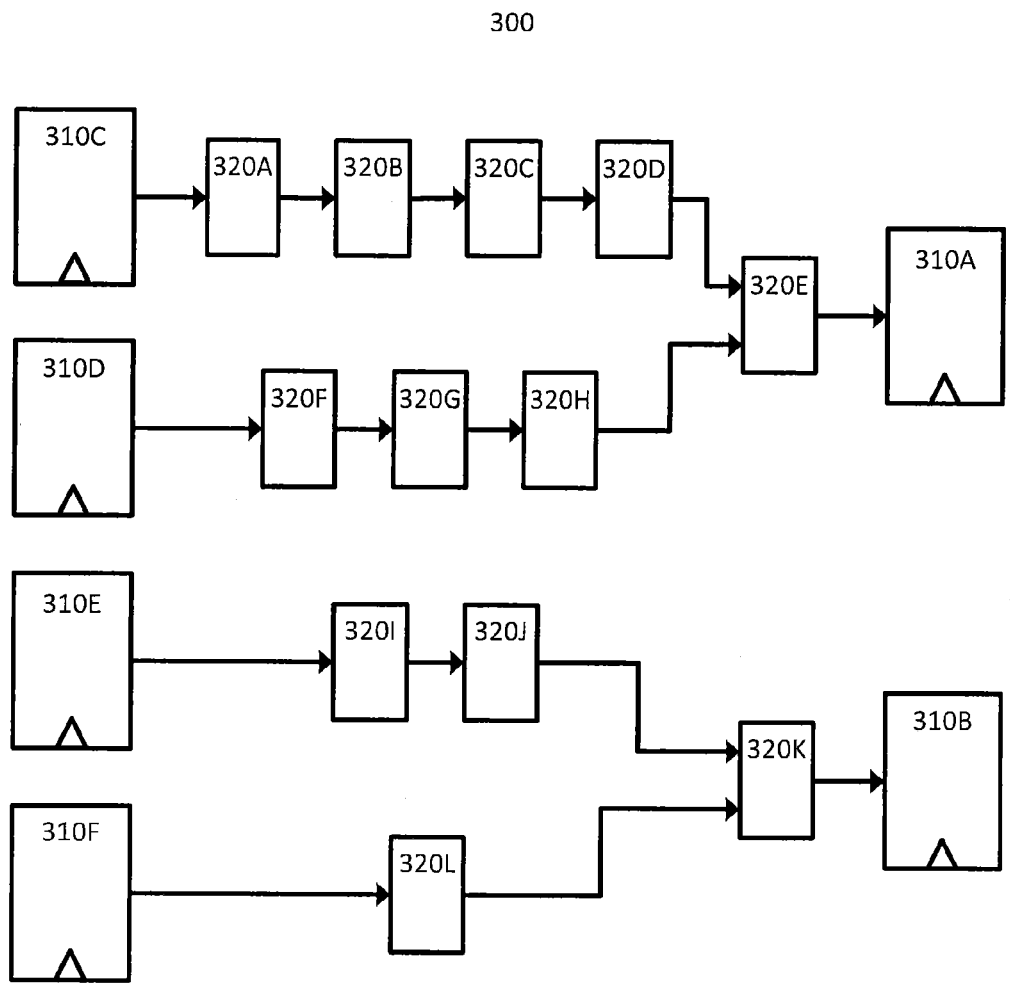
FIG. 3 is a schematic diagram illustrating a circuit according to some embodiments of the inventive concept.

Reference is now made to FIG. 3, which is a schematic diagram illustrating a circuit according to some embodiments of the inventive concept. In some embodiments, a circuit 300 may include one or more flip flops 310A-F and one or more logic gates 320A-320L. Ones of the flip flops 310A-F may sample a respective input at a triggering clock edge and maintain the sampled value at a respective output until the next triggering clock edge. The logic gates 320A-L may output a value based on one or more inputs according to a logic function. The logic gates 320A-L may include a plurality of stacked nanosheet FETs 100 configured to provide the output value based on the one or more inputs according to the logic function. Some of the logic gates 320A-L may be combined to provide more complex logic functions. For example, the input of flip flop 310A may be based, for example, on outputs of flip flops 310C-D through a logic function provided by, for example, logic gates 320A-H. Similarly, the input of flip flop 310B may be based, for example, on outputs of flip flops 310E-F through a logic function provided by, for example, logic gates 320I-L. However, the invention is not limited to the particular arrangement of flip-flops 310A-F and logic gates 320A-L illustrated in FIG. 3.

Data paths may include a series of logic gates between an output and an input. For example, the data path from the output of flip flop 310C to the input of flip flop 310A may include five logic gates 320A-E. The data path from the output of flip flop 310D to the input of flip flop 310A may include four logic gates 320E-H. The data path from the output of flip flop 310E to the input of flip flop 310B may include three logic gates 320I-K. The data path from the output of flip flop 310F to the input of flip flop 310B may include two logic gates 320K-L. A propagation delay across a data path may be proportional to the quantity of logic gates of the data path. For example, a propagation delay of the data path from the output of flip flop 310C to the input of flip flop 310A, may be longer than a propagation delay of the data path from the output of flip flop 310D to the input of flip flop 310A, which may be longer than a propagation delay of the data path from the output of flip flop 310E to the input of flip flop 310B, which may be longer than a propagation delay of the data path from the output of flip flop 310F to the input of flip flop 310B.

However, other factors may affect a propagation delay. For example, a complexity of a logic gate may increase the propagation delay across that gate, which may increase the propagation delay for data paths including that logic gate. For example, a logic gate that is an AND gate may include more transistors than a logic gate which is an inverter. Therefore, a propagation delay across the AND gate may be higher than a propagation delay across the inverter. Also, a propagation delay may be affected by the type of transistors of a logic gate. For example, a propagation delay across a logic gate including non-Si nanosheet FETs may be smaller than a propagation delay across a logic gate of equivalent complexity including Si nanosheet FETs.

A propagation delay may determine a maximum time until an input of a flip flop at an end of the data path is valid after a change in an output of a flip flop at the beginning of the data path. A clock cycle time of the circuit 300 may not be shorter than the smallest propagation delay of the data paths of the circuit 300. Therefore, a clock speed of the circuit 300 may be limited by the maximum propagation delay of the data paths of the circuit 300. One or more of the data paths of the circuit 300 with the largest propagation delays may be referred to as the critical speed paths of the circuit 300. A reduction in the propagation delay of a critical speed path may therefore increase the maximum clock speed of the circuit 300. For example, in some embodiments, the critical speed paths of the circuit 300 may include the data path from the output of flip flop 310C to the input of flip flop 310A. In some embodiments, the critical speed paths of the circuit 300 may include the data path from the output of flip flop 310D to the input of flip flop 310A. According to some embodiments of the inventive concept, co-integration of Si nanosheet FETs and non-Si nanosheet FETs based on the critical speed paths of the circuit 300 may provide the circuit 300 with both high performance and low power, as discussed below in more detail.

Figure 4:
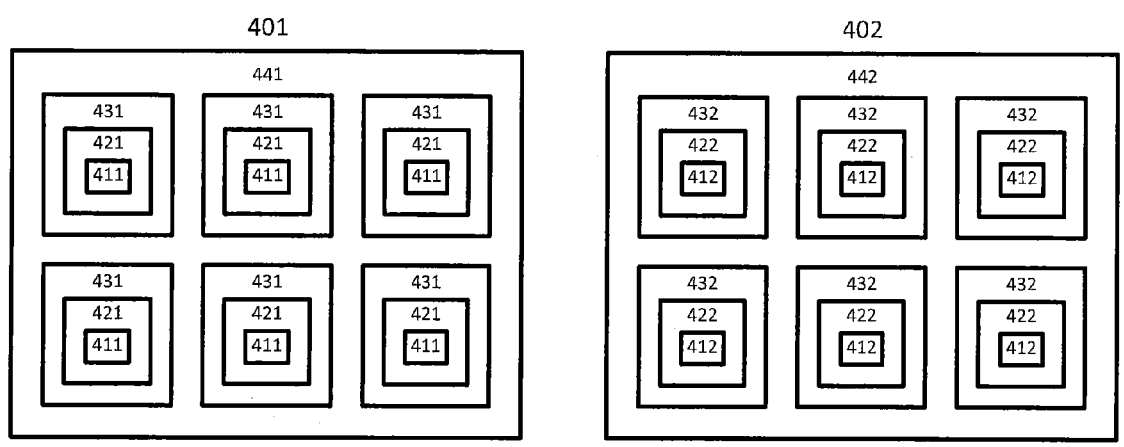
FIG. 4 is a cross sectional view schematically illustrating a Si nanosheet FET and a non-Si nanosheet FET according to some embodiments of the inventive concept.

Reference is now made to FIG. 4, which is a cross sectional view schematically illustrating a Si nanosheet FET and a non-Si nanosheet FET according to some embodiments of the inventive concept. Referring to FIGS. 3-4, in some embodiments, a Si nanosheet FET 401 and a non-Si nanosheet FET 402 may be co-integrated into the circuit 300. However, the circuit 300 may include a plurality of Si nanosheet FETs 401 and/or a plurality of non-Si nanosheet FETs 402. The Si nanosheet FETs 401 may correspond to the transistors of ones of the logic gates 320A-L. The non-Si nanosheet FETs 402 may correspond to the transistors of other ones of the logic gates 320A-L. In some embodiments, a logic gate of the logic gates 320A-L may include one or more of the Si nanosheet FETs 401 and the non-Si nanosheet FETs 402.

Referring to FIGS. 1A-C and 4, the Si nanosheet FET 401 may be substantially similar to the stacked nanosheet FET 100 of FIGS. 1A-C except for differences as described below. Descriptions of similar elements may be omitted for brevity. For example, in some embodiments, the Si nanosheet FET 401 may include a plurality of vertically stacked channel patterns including a plurality of nanosheets 411 that may be similar to the plurality of vertically stacked channel patterns including the plurality of nanosheets 110 of the stacked nanosheet FET 100, as discussed above with reference to FIGS. 1A-1C. Ones of the plurality of nanosheets 411 may include Si or may include a large percentage of Si, for example $Si_xGe_{1-x}$, where x is greater than about 0.3. Further, in some embodiments, the Si nanosheet FET 401 may include a gate stack including a gate dielectric material 421, a work function tuning metal layer 431, and a low resistance gate metal layer 441 that may be similar to the gate stack including the gate dielectric material 120, the work function tuning metal layer 130, and the low resistance gate metal layer 140, as discussed above with reference to FIGS. 1A-1C.

Similarly, the non-Si nanosheet FET 402 may be substantially similar to the stacked nanosheet FET 100 of FIGS. 1A-C except for differences as described below. Descriptions of similar elements may be omitted for brevity. For example, in some embodiments, the non-Si nanosheet FET 402 may include a plurality of vertically stacked channel patterns including a plurality of nanosheets 412 that may be similar to the plurality of vertically stacked channel patterns including the plurality of nanosheets 110 of the stacked nanosheet FET 100, as discussed above with reference to FIGS. 1A-1C. Ones of the plurality of nanosheets 412 may not include Si or may include a small percentage of Si. For example, ones of the plurality of nanosheets 412 may include InGaAs and/or may include $Si_yGe_{1-y}$, where y is less than about 0.3. Further, in some embodiments, the non-Si nanosheet FET 402 may include a gate stack including a gate dielectric material 422, a work function tuning metal layer 432, and a low resistance gate metal layer 442 that may be similar to the gate stack including the gate dielectric material 120, the work function tuning metal layer 130, and the low resistance gate metal layer 140, as discussed above with reference to FIGS. 1A-1C.

In some embodiments, the plurality of non-Si nanosheet FETs 402 may include a plurality of n-type FETs and a plurality of p-type FETs. Ones of the plurality of n-type FETs and respective ones of the plurality of p-type FETs may provide a plurality of complementary pairs of nanosheet FETs. In some embodiments, nanosheets 412 of the plurality of n-type FETs may include a Group III-V semiconductor. For example, nanosheets 412 of the plurality of n-type FETs may include InGaAs. In some embodiments, nanosheets 412 of the plurality of p-type FETs may include $Si_yGe_{1-y}$, where y is less than about 0.3. In some embodiments, ones of the plurality of Si nanosheet FETs 401 may include a greater number of nanosheets per Si nanosheet FET 401 than a number of nanosheets per non-Si nanosheet FET 402 of ones of the plurality of n-type FETs and ones of the plurality of p-type FETs. In some embodiments, a surface orientation of top and bottom surfaces of the nanosheets 412 of the plurality of n-type FETs may be (100). In some embodiments, a surface orientation of top and bottom surfaces of the nanosheets 412 of the plurality of p-type FETs may be (110). In some embodiments, nanosheets 412 of the plurality of n-type FETs and nanosheets of the plurality of p-type FETs may each include $Si_yGe_{1-y}$, where y is less than about 0.3, a surface orientation of top and bottom surfaces of the nanosheets 412 of the plurality of n-type FETs may be (111), and a surface orientation of top and bottom surfaces of the nanosheets 412 of the plurality of p-type FETs may be (110).

In some embodiments, a performance of ones of the non-Si nanosheet FETs 402 that include nanosheets 412 that include $Si_yGe_{1-y}$, where y is less than about 0.3, may be higher than a performance of ones of the Si nanosheet FETs 401. However, a BTBT leakage current of the ones of the non-Si nanosheet FETs 402 that include nanosheets 412 that include $Si_yGe_{1-y}$, where y is less than about 0.3, may be higher than a BTBT leakage current of ones of the Si nanosheet FETs 401.

In some embodiments, a ratio of the total leakage current, including BTBT leakage current, of the ones of the non-Si nanosheet FETs 402 to an effective channel conduction width of the ones of the non-Si nanosheet FETs 402 may be greater than a ratio of the total leakage current of the ones of the Si nanosheet FETs 401 to an effective channel conduction width of the ones of the Si nanosheet FETs 401. In some embodiments, the ratio of the total leakage current of the ones of the non-Si nanosheet FETs 402 to the effective channel conduction width of the ones of the non-Si nanosheet FETs 402 may be greater than double the ratio of the total leakage current of the ones of the Si nanosheet FETs 401 to the effective channel conduction width of the ones of the Si nanosheet FETs 401. In some embodiments, the ratio of the total leakage current of the ones of the non-Si nanosheet FETs 402 to the effective channel conduction width of the ones of the non-Si nanosheet FETs 402 may be greater than five times the ratio of the total leakage current of the ones of the Si nanosheet FETs 401 to the effective channel conduction width of the ones of the Si nanosheet FETs 401.

In some embodiments, an effective drive current, $I_{eff}$, of the ones of the non-Si nanosheet FETs 402 may be less than an effective drive current of the ones of the Si nanosheet FETs 401. In some embodiments, an effective conduction width, $W_{eff}$, of the ones of the non-Si nanosheet FETs 402 may be less than an effective conduction width of the ones of the Si nanosheet FETs 401. In some embodiments, the ones of the non-Si nanosheet FETs 402 may include a quantity of nanosheets 412 per non-Si nanosheet FET 402 that is smaller than a quantity of nanosheets 411 per Si nanosheet FET 401. In some embodiments, ones of the nanosheets 412 may include a width that is smaller than a width of ones of the nanosheets 411.

In some embodiments, ones of the logic gates 320A-L that correspond to critical speed paths of the circuit 300 may include the ones of the non-Si nanosheet FETs 402 that include nanosheets 412 that include $Si_yGe_{1-y}$, where y is less than about 0.3, and ones of the logic gates 320A-L that correspond to non-critical speed paths of the circuit 300 may include the ones of the Si nanosheet FETs 401. Therefore, the higher performance of the non-Si nanosheet FETs 402 may reduce a propagation delay of the critical speed paths of the circuit 300 and, therefore, increase a maximum clock speed of the circuit 300, while the lower BTBT leakage current of the Si nanosheet FETs 401 may reduce a power consumption of the circuit 300. Therefore, according to some embodiments of the inventive concept, co-integration of the Si nanosheet FETs 401 and the non-Si nanosheet FETs 402 may provide the circuit 300 with both high performance and low power.

In some embodiments, some of the data paths of the circuit 300 may allow for transistors with a low source-channel barrier. As discussed above with reference to Eqn. 1, BTBT leakage current may be limited in a co-integrated integrated circuit by utilizing the non-Si nanosheet FETs in portions of the integrated circuit that allow for a FET with a low source-channel barrier. Therefore, according to some embodiments of the inventive concept, the critical speed paths of the circuit 300 that allow for a FET with a low source-channel barrier may include the ones of the non-Si nanosheet FETs 402 that include nanosheets 412 that include $Si_yGe_{1-y}$, where y is less than about 0.3. For example, in some embodiments, a low source-channel barrier height may be less than 250 meV (for an SLVT device). In some embodiments, the low source-channel barrier height may limit the BTBT leakage current. For example, the low source-channel barrier height may limit the BTBT leakage current to substantially less than a conventional sub-threshold leakage current, such that the total leakage current has no significant contribution from band-to-band tunneling induced current. Therefore, the non-Si nanosheet FETs 402 may be utilized to increase a performance of the integrated circuit without significantly increasing a power consumption of the integrated circuit due to BTBT leakage current.

In some embodiments, some of the data paths of the circuit 300 may operate at a lower threshold voltage, $V_T$, to form the low source-channel barrier. For example, the non-Si nanosheet FETs 402 may include low voltage (LVT) and/or super low voltage (SLVT) FETs. The work function tuning metal layer 432 of ones of the non-Si nanosheet FETs 402 may be configured to enable the sufficiently low respective threshold voltage of the ones of the non-Si nanosheet FETs 402. The threshold voltage of the ones of the non-Si nanosheet FETs 402 may be lower than a threshold voltage of ones of the Si nanosheet FETs 401.

Figure 5:
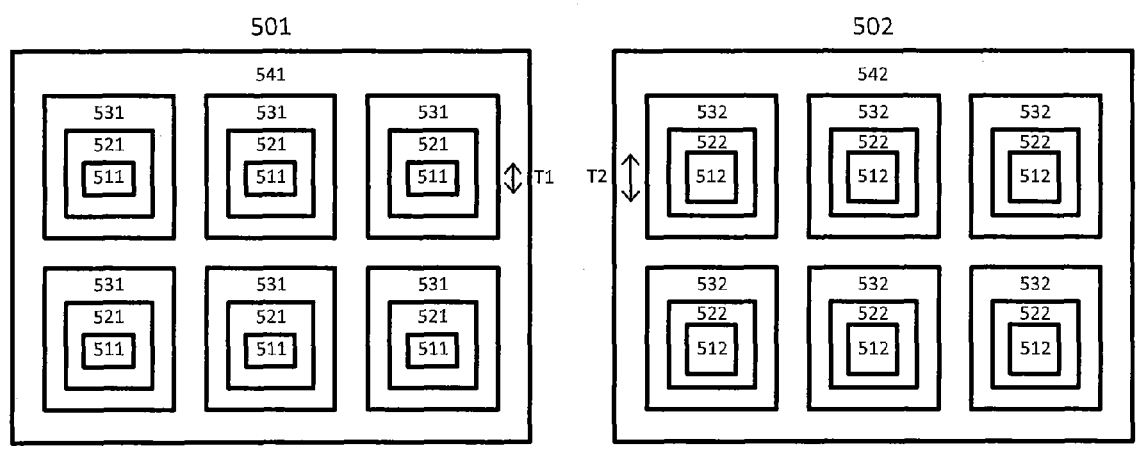
FIG. 5 is a cross sectional view schematically illustrating a Si nanosheet FET and a non-Si nanosheet FET according to some embodiments of the inventive concept.

Reference is now made to FIG. 5, which is a cross sectional view schematically illustrating a Si nanosheet FET and a non-Si nanosheet FET according to some embodiments of the inventive concept. Referring to FIGS. 4 and 5, a Si nanosheet FET 501 may be substantially similar to the Si nanosheet FET 401 of FIG. 4 and a non-Si nanosheet FET 502 may be substantially similar to the non-Si nanosheet FET 402 of FIG. 4, except for differences as described below. Descriptions of similar elements may be omitted for brevity.

For example, in some embodiments, the Si nanosheet FET 501 may include a plurality of vertically stacked channel patterns including a plurality of nanosheets 511 that may be similar to the plurality of vertically stacked channel patterns including the plurality of nanosheets 411 of the Si nanosheet FET 401, as discussed above with reference to FIG. 4. Further, in some embodiments, the Si nanosheet FET 501 may include a gate stack including a gate dielectric material 521, a work function tuning metal layer 531, and a low resistance gate metal layer 541 that may be similar to the gate stack including the gate dielectric material 421, the work function tuning metal layer 431, and the low resistance gate metal layer 441, as discussed above with reference to FIG. 4.

Similarly, in some embodiments, the non-Si nanosheet FET 502 may include a plurality of vertically stacked channel patterns including a plurality of nanosheets 512 that may be similar to the plurality of vertically stacked channel patterns including the plurality of nanosheets 412 of the non-Si nanosheet FET 402, as discussed above with reference to FIG. 4. Further, in some embodiments, the non-Si nanosheet FET 502 may include a gate stack including a gate dielectric material 522, a work function tuning metal layer 532, and a low resistance gate metal layer 542 that may be similar to the gate stack including the gate dielectric material 422, the work function tuning metal layer 432, and the low resistance gate metal layer 442, as discussed above with reference to FIG. 4.

In some embodiments, the circuit 300 may include a plurality of Si nanosheet FETs 501 and a plurality of non-Si nanosheet FETs 502. In some embodiments, a low source-channel barrier of the non-Si nanosheet FETs may allow for the use of thicker nanosheets 512 in ones of the non-Si nanosheet FETs 502. For example, a thickness of the nanosheets 512 of the ones of the non-Si nanosheet FETs 502 may be greater than a thickness of the nanosheets 511 of ones of the Si nanosheet FETs 501. In some embodiments, a thickness of the nanosheets 512 of the ones of the non-Si nanosheet FETs 502 may be greater than a critical thickness of the nanosheets 412 of the ones of the non-Si nanosheet FETs 402. As used herein, the term "critical thickness" refers to a thickness below which a carrier mobility and FET performance are substantially decreased. In some embodiments, the critical thickness of a nanosheet 412 that includes InGaAs may be in a range of about 6 to about 10 nm, and more specifically in a range of about 7 to about 10 nm.

In some embodiments, a thickness of the nanosheets 512 of ones of the non-Si nanosheet FETs 502 may not be the same as a thickness of the nanosheets 512 of other ones of the non-Si nanosheet FETs 502. For example, the nanosheets 512 of ones of a first subset of the plurality of non-Si nanosheet FETs 502 may have a first thickness that is greater than a second thickness of ones of a second subset of the plurality of non-Si nanosheet FETs 502. A difference between the first thickness and the second thickness may be sufficiently large to affect at least one of a threshold voltage, $V_T$, a carrier mobility, and an effective drive current of the first subset of the plurality of non-Si nanosheet FETs 502.

Figure 6A:
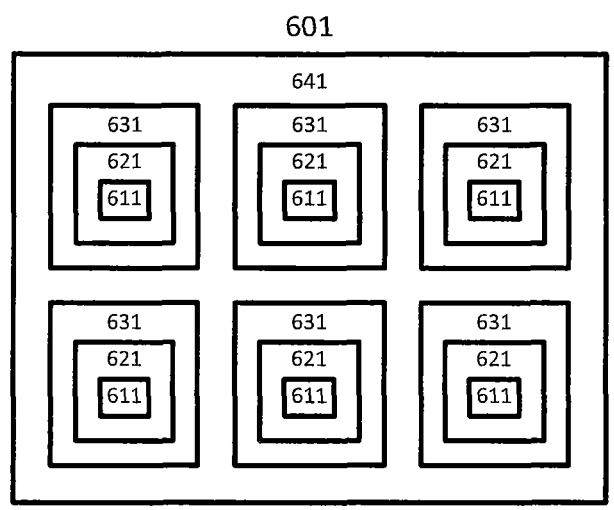
FIG. 6A is a cross sectional view schematically illustrating a non-Si nanosheet FET according to some embodiments of the inventive concept.

Reference is now made to FIG. 6A, which is a cross sectional view schematically illustrating a non-Si nanosheet FET according to some embodiments of the inventive concept. Referring to FIGS. 4 and 6A, a non-Si nanosheet FET 601 may be substantially similar to the non-Si nanosheet FET 402 of FIG. 4, except for differences as described below. Descriptions of similar elements may be omitted for brevity.

For example, in some embodiments, the non-Si nanosheet FET 601 may include a plurality of vertically stacked channel patterns including a plurality of nanosheets 611 that may be similar to the plurality of vertically stacked channel patterns including the plurality of nanosheets 412 of the non-Si nanosheet FET 402, as discussed above with reference to FIG. 4. For example, the plurality of nanosheets 611 may not include Si or may include less than about 30% Si. In some embodiments, the non-Si nanosheet FET 601 may include a gate stack including a gate dielectric material 621, a work function tuning metal layer 631, and a low resistance gate metal layer 641 that may be similar to the gate stack including the gate dielectric material 422, the work function tuning metal layer 432, and the low resistance gate metal layer 442, as discussed above with reference to FIG. 4.

In some embodiments, the integrated circuit may include a plurality of non-Si nanosheet FETs 601. Referring to FIGS. 3 and 6A, in some embodiments, ones of the logic gates 320A-L that correspond to non-critical speed paths of the circuit 300 may include the ones of the non-Si nanosheet FETs 601. In some embodiments, a gate loaded circuit may include ones of the plurality of non-Si nanosheet FETs 601. The gate loaded circuit may include a plurality of logic gates with a front-end-of-line (FEOL) capacitance that is greater than about 50% of a total capacitance of the gate loaded circuit. In some embodiments, the gate loaded circuit may include a plurality of logic gates with a FEOL capacitance that is greater than about 60% of a total capacitance of the gate loaded circuit. A non-gate loaded circuit may include ones of the plurality of Si nanosheet FETs 401. The non-gate loaded circuit may include a FEOL capacitance that is less than about 50% of a total capacitance of the non-gate loaded circuit. In some embodiments, the non-gate loaded circuit may include a FEOL capacitance that is less than about 60% of a total capacitance of the non-gate loaded circuit.

Referring to FIGS. 3, 4, and 6A, in some embodiments, the plurality of Si nanosheet FETs 401 may be used in paths on the chip for which the lower performance of the Si nanosheet FETs 401, compared to non-Si nanosheet FETs 601, is not detrimental to the overall performance of the chip. For example, in some embodiments, Si nanosheet FETs 401 may be used in back-end-of-line (BEOL) and/or middle-of-the-line (MOL) loaded circuits where a number of horizontal layers of nanosheets 411 of the Si nanosheet FETs 401 may be larger than a number of horizontal layers of nanosheets 611 of the non-Si nanosheet FETs 601 and where a threshold voltage, $V_T$, of the Si nanosheet FETs 401 may be greater than a threshold voltage of the non-Si nanosheet FETs 601. The BEOL loaded circuit may include a plurality of logic gates with a BEOL capacitance that is greater than about 50% of a total capacitance of the BEOL loaded circuit. In some embodiments, the BEOL loaded circuit may include a plurality of logic gates with a BEOL capacitance that is greater than about 60% of a total capacitance of the BEOL loaded circuit.

In some embodiments, ones of the plurality of nanosheets 611 may include InGaAs. Referring to FIGS. 5 and 6A, a thickness of the ones of the plurality of nanosheets 611 may be thinner than a thickness of the ones of the plurality of nanosheets 512. In some embodiments, a thickness of the ones of the nanosheets 611 may be less than a critical thickness of the nanosheets 611. Because the nanosheets 611 of the non-Si nanosheet FETs 601 are thinner, in some embodiments, a performance of ones of the non-Si nanosheet FETs 601 may be lower than a performance of ones of the non-Si nanosheet FETs 502. However, a BTBT leakage current of the ones of the non-Si nanosheet FETs 601 may be lower than a BTBT leakage current of ones of the Si nanosheet FETs 502.

Figure 6B:
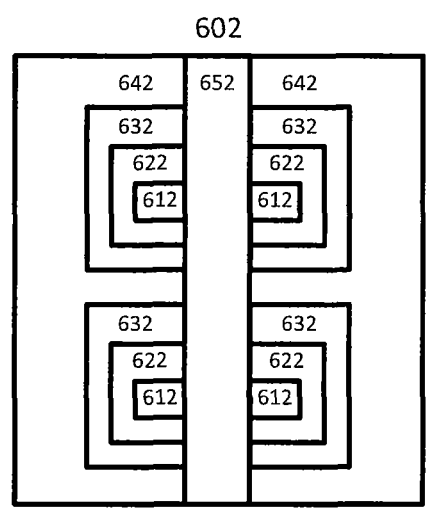
FIG. 6B is a cross sectional view schematically illustrating a non-Si nanosheet FET according to some embodiments of the inventive concept.

Reference is now made to FIG. 6B, which is a cross sectional view schematically illustrating a non-Si nanosheet FET according to some embodiments of the inventive concept. Referring to FIGS. 4 and 6B, a non-Si nanosheet FET 602 may be substantially similar to the non-Si nanosheet FET 402 of FIG. 4, except for differences as described below. Descriptions of similar elements may be omitted for brevity.

For example, in some embodiments, the non-Si nanosheet FET 602 may include a plurality of vertically stacked channel patterns including a plurality of nanosheets 612 that may be similar to the plurality of vertically stacked channel patterns including the plurality of nanosheets 412 of the non-Si nanosheet FET 402, as discussed above with reference to FIG. 4. In some embodiments, ones of the plurality of nanosheets 612 may include a small percentage of Si, for example $Si_yGe_{1-y}$, where y is less than about 0.3. In some embodiments, the non-Si nanosheet FET 602 may include a gate stack including a gate dielectric material 622, a work function tuning metal layer 632, and a low resistance gate metal layer 642 that may be similar to the gate stack including the gate dielectric material 422, the work function tuning metal layer 432, and the low resistance gate metal layer 442, as discussed above with reference to FIG. 4. In some embodiments, the non-Si nanosheet FET 602 may be a tri-gate nanosheet FET. In other words, the gate stack may surround three sides of portions of nanosheets 612. In some embodiments, the dielectric layer 622, the work function tuning metal layer 632, and the low resistance gate metal layer 642 may surround only three sides of the portions of the nanosheets 612. In some embodiments, the non-Si nanosheet FET 602 may include a dielectric interface 652 between horizontally adjacent ones of the nanosheets 612. For example, the dielectric interface 652 may be on inner surfaces of the nanosheets 612 between horizontally adjacent ones of the nanosheets 612.

In some embodiments, the integrated circuit may include a plurality of non-Si nanosheet FETs 602. Referring to FIGS. 3 and 6B, in some embodiments, ones of the logic gates 320A-L that correspond to non-critical speed paths of the circuit 300 may include the ones of the non-Si nanosheet FETs 602. In some embodiments, a gate loaded circuit may include ones of the plurality of non-Si nanosheet FETs 602. The gate loaded circuit may include a plurality of logic gates with a front-end-of-line (FEOL) capacitance that is greater than about 50% of a total capacitance of the gate loaded circuit. In some embodiments, the gate loaded circuit may include a plurality of logic gates with a FEOL capacitance that is greater than about 60% of a total capacitance of the gate loaded circuit. A non-gate loaded circuit may include ones of the plurality of Si nanosheet FETs 401. The non-gate loaded circuit may include a FEOL capacitance that is less than about 50% of a total capacitance of the non-gate loaded circuit. In some embodiments, the non-gate loaded circuit may include a FEOL capacitance that is less than about 60% of a total capacitance of the non-gate loaded circuit.

Figure 7:
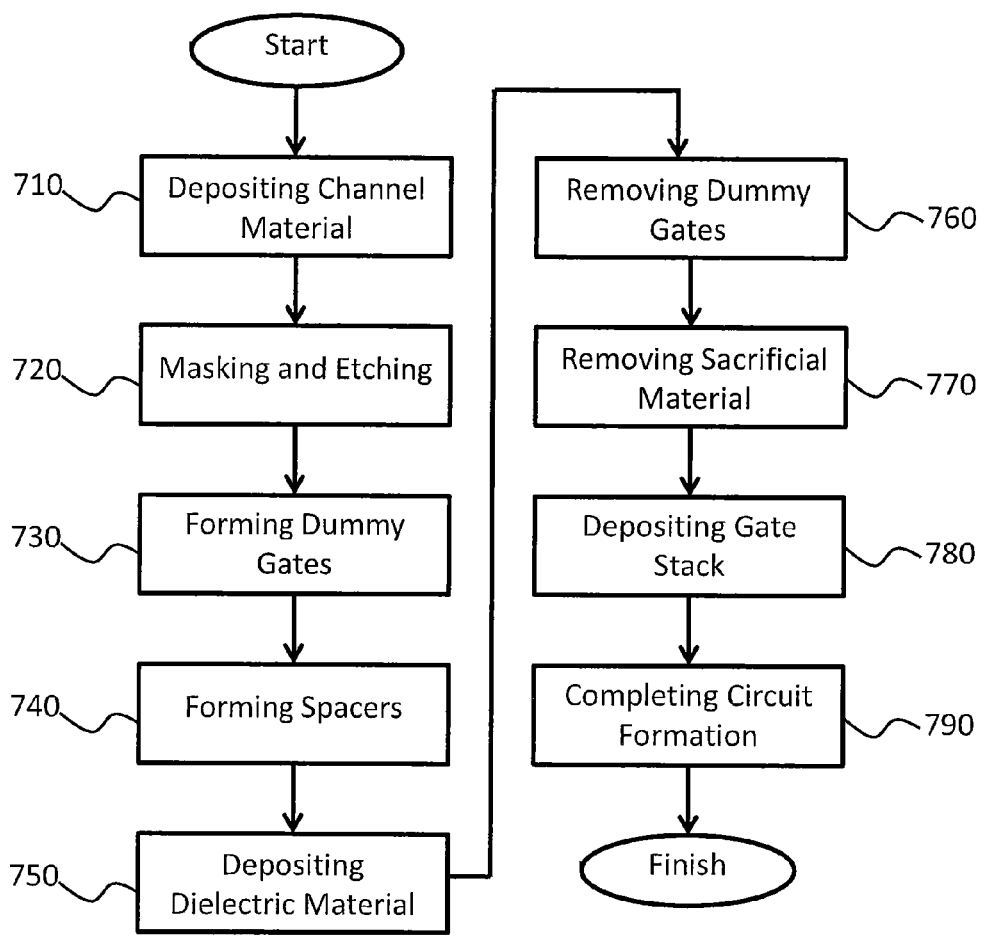
FIG. 7 is a flowchart illustrating methods of manufacturing integrated circuits according to some embodiments of the inventive concept.

Reference is now made to FIG. 7, which is a flowchart illustrating methods of manufacturing integrated circuits according to some embodiments of the inventive concept. The methods will be described with reference to the Si nanosheet FET 401 and the non-Si nanosheet FET 402 of FIG. 4. However, in some embodiments, the described methods of manufacturing integrated circuits may produce one or more of the nanosheet FETs of FIGS. 5-6B according to other embodiments of the inventive concept.

Referring to FIGS. 4 and 7, in some embodiments, methods of forming integrated circuits may include depositing channel material (block 710). Depositing channel material may include a stacked layer-by-layer deposition of a conduction channel material interspersed by sacrificial material. In some embodiments, the depositing channel material may be performed separately for Si nanosheet FETs and non-Si nanosheet FETs.

In some embodiments, the conduction channel material for a non-Si nanosheet FET, for the case of InGaAs material, may be deposited at a thickness greater than a thickness of the conduction channel material for a Si nanosheet FET. In some embodiments, the conduction channel material for a non-Si nanosheet FET, for the case of Ge (or SiGe) material, may be the same thickness as a Si nanosheet FET. In some embodiments, depositing the channel material may include depositing the channel material at a thickness above a critical thickness, for example, greater than about 7 nm for InGaAs, where the thickness is configured to result in sufficiently high mobility and performance. In some embodiments, depositing the channel material may include depositing the channel material at a thickness below a critical thickness, for example, less than about 7 nm for InGaAs, where the thickness is configured to produce a low BTBT leakage current. In some embodiments, the conduction material for a non-Si FET may be formed in a region of the integrated circuit defined as critical speed path. The number of layer depositions of conduction channel material may be larger for Si nanosheet FETs than the number of layer depositions of conduction channel material for non-Si nanosheet FETs. A set of protective masking layers may be used for independent formation of nFET and pFET stacked layers for the Si nanosheet FETs and a set of protective masking layers may be used for independent formation of nFET and pFET stacked layers for the non-Si nanosheet FETs. Similarly, one or more of the remaining actions of the methods may be performed separately for each type of FET (n-type and p-type) and/or for the Si nanosheet FETs and for the non-Si nanosheet FETs.

The methods may include masking and etching (block 720). Masking and etching may include patterning and etching the stacked layers into desired dimensions to define the width of each nanosheet and horizontal spacing between each nanosheet, in each horizontal plane. In some embodiments, the length of each nanosheet may also be defined within this action but, in some embodiments, may be defined at another action. A single mask and etch, or multiple masks and etches, may be used to define the width and spacing between each nanosheet, in each horizontal plane. In some embodiments, an etch, for example a dry etch, that is not selective to either of the conduction channel material or sacrificial material may be utilized. In some embodiments, a multiple-etch process using different etch gas chemistries to selectively etch each of the conduction channel material and sacrificial material may be utilized.

The methods may include forming dummy gates (block 730), forming spacers (740), depositing dielectric material (block 750), removing dummy gates (block 760), and removing sacrificial material (block 770). In some embodiments, removing sacrificial material may include a wet etch process and/or combination wet/dry etch. The resultant conduction channel nanosheets may be supported by the spacers remaining after dummy gate removal. At this point, the vertical spacing between horizontal layers of nanosheets and the horizontal spacing between nanosheets in each horizontal layer may be fully defined, with the horizontal spacing chosen to be same or different than the vertical spacing. In some embodiments, the horizontal and vertical spacing may be the same.

The methods may include depositing a gate stack (block 780) within the removed dummy gate regions. In some embodiments, the gate stack may be deposited by means including an ALD (atomic-layer deposition) process. The gate stack material may be formed uniformly on exposed surfaces of portions of separated nanosheets. The gate stack may include a gate dielectric and a gate metal. In some embodiments, the gate metal may include a work-function tuning metal and low resistance capping metal. In some embodiments, the work-function tuning metal for a non-Si nanosheet FET, for the case of Ge conduction channel material, may be chosen such that the Ge nanosheet FET is a LVT (low threshold voltage) or SLVT (super-low threshold voltage) device, having a threshold voltage, $V_T$, sufficiently low to form a low source-channel barrier such that the Ge nanosheet FET has a low BTBT current. In some embodiments, a work function tuning metal for a non-Si nanosheet FET including thicker (compared to Si) InGaAs conduction channel material may be chosen such that the InGaAs nanosheet FET is a LVT or SLVT device, having a threshold voltage, $V_T$, sufficiently low to form a low source-channel barrier such that the InGaAs nanosheet FET has a low BTBT current. In some embodiments, a work function tuning metal for a Si nanosheet FET may be chosen such that the Si nanosheet FET may have a higher $V_T$ than the non-Si nanosheet FET, the Si nanosheet FET having lower $I_{off}$ (nA/um).

The methods may include completing the formation of the remainder of the integrated circuit (block 790). The completing the formation of the remainder of the integrated circuit may include one or more of chemical-mechanical planarization to enable gate metal only in the removed dummy gate regions, contact formation, and BEOL formation. In some embodiments with Si and non-Si nanosheet FETs, a Si nanosheet FET may have a larger number of layers of conduction channel material, higher $V_T$, and lower $I_{off}$. In some embodiments, a non-Si nanosheet FET including Ge may have a low source-channel barrier. In some embodiments, a non-Si nanosheet FET including InGaAs may have a thicker conduction channel material than the Si nanosheet FET. In some embodiments, non-Si nanosheet FETs may be formed in critical-speed-paths of the integrated circuit. A co-integration of Si nanosheet FETs and non-Si nanosheet FETs may enable a low power and high performance integrated circuit.

Referring to FIGS. 6B and 7, in some embodiments, the methods may form a non-Si nanosheet FET 602, as illustrated in FIG. 6B. For example, the masking and etching (block 720) may include patterning and etching slots to define two nanosheets in each horizontal layer, and deposition and etch back of a dielectric to fill the slots prior to undercut of sacrificial material. The dielectric may be formed along inner edges of the nanosheets. The dielectric may include a high K dielectric material. An interface of the dielectric material to the inner edge (inner surface) of a nanosheet may be different, and may be poorer, than interfaces of the dielectric material to other edges (surfaces) of the same nanosheet. For example, the interface formed along the inner edges of the nanosheets may have more dangling bonds and interface states, due to different passivation of the nanosheets along the inner edges, with the dangling bonds and interface states acting as recombination centers for nearby carriers.

While the inventive concept has been described with reference to some embodiments, it will be apparent to those skilled in the art that various changes and modifications may be made without departing from the spirit and scope of the inventive concept. It should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An integrated circuit comprising:
   a plurality of first nanosheet field-effect transistors (FETs), nanosheets of ones of the first nanosheet FETs comprising less than about 30% Si, the plurality of first nanosheet FETs defining a critical speed path; and
   a plurality of second nanosheet FETs, nanosheets of ones of the second nanosheet FETs comprising more than about 30% Si, the plurality of second nanosheet FETs defining a non-critical speed path, ones of the first nanosheet FETs configured to have a higher speed than a speed of ones of the second nanosheet FETs.

2. The integrated circuit of claim 1, wherein ones of the first nanosheet FETs comprise a barrier height from source to channel below a threshold value that is sufficient to limit the band-to-band tunneling induced current such that a total leakage current of the ones of the first nanosheet FETs has no significant contribution from the band-to-band tunneling induced current.

3. The integrated circuit of claim 2, wherein a thickness of nanosheets of ones of the first nanosheet FETs is greater than a critical thickness of the nanosheets of the ones of the first nanosheet FETs.

4. The integrated circuit of claim 1,
   further comprising a plurality of third nanosheet FETs in the non-critical speed path,
   wherein nanosheets of ones of the third nanosheet FETs comprise less than about 30% Si,
   wherein ones of the second nanosheet FETs comprise a first front-end-of-line (FEOL) capacitance that is less than 50% of a total capacitance of the ones of the second plurality of nanosheet FETs, and
   wherein ones of the third nanosheet FETs comprise a second front-end-of-line (FEOL) capacitance that is greater than 50% of a total capacitance of the ones of the third nanosheet FETs.

5. The integrated circuit of claim 4,
   wherein the nanosheets of the ones of the third nanosheet FETs comprise more than about 70% Ge, and wherein the ones of the third nanosheet FETs comprise gates that surround three sides of portions of respective nanosheets of the ones of the third plurality of nanosheets.

6. The integrated circuit of claim 5,
wherein the nanosheets of the ones of the third nanosheet FETs comprise inner surfaces between horizontally adjacent ones of the nanosheets of the ones of the third nanosheet FETs, and
wherein the ones of the third nanosheet FETs further comprise respective dielectric interfaces on the inner surfaces of the nanosheets of the ones of the third nanosheet FETs.

7. The integrated circuit of claim 4,
wherein the nanosheets of the ones of the third nanosheet FETs comprise InGaAs, and
wherein the ones of the third nanosheet FETs comprise gates that surround three sides of portions of respective nanosheets of the ones of the third plurality of nanosheets.

8. The integrated circuit of claim 7,
wherein the nanosheets of the ones of the third nanosheet FETs comprise inner surfaces between horizontally adjacent ones of the nanosheets of the ones of the third nanosheet FETs, and
wherein the ones of the third nanosheet FETs further comprise respective dielectric interfaces on the inner surfaces of the nanosheets of the ones of the third nanosheet FETs.

9. The integrated circuit of claim 4,
wherein the nanosheets of the ones of the third nanosheet FETs comprise InGaAs, and
wherein a thickness of the nanosheets of the ones of the third nanosheet FETs is less than a critical thickness of a composition of the nanosheets of the ones of the third nanosheet FETs.

10. The integrated circuit of claim 1, wherein a first ratio of a leakage current to an effective channel conduction width of the ones of the first nanosheet FETs is greater than a second ratio of a leakage current to an effective channel conduction width of the ones of the second nanosheet FETs.

11. The integrated circuit of claim 10, wherein a first effective drive current, $I_{eff}$, of the ones of the first nanosheet FETs is less than a second effective drive current of the ones of the second nanosheet FETs.

12. The integrated circuit of claim 11, wherein a first effective channel conduction width of the ones of the first nanosheets FETs is less than a second effective channel conduction width of the ones of the second nanosheet FETs.

13. The integrated circuit of claim 12, wherein the ones of the first nanosheet FETs comprise a first quantity of nanosheets per FET and wherein the ones of the second nanosheet FETs comprise a second quantity of nanosheets per FET that is greater than the first quantity of nanosheets per FET.

14. The integrated circuit of claim 12, wherein the nanosheets of the ones of the first nanosheet FETs comprise a first width and wherein the nanosheets of the ones of the second nanosheet FETs comprise a second width that is greater than the first width.

15. The integrated circuit of claim 11, wherein the ones of the first nanosheet FETs comprise a first threshold voltage, $V_T$, and wherein the ones of the second nanosheet FETs comprise a second threshold voltage that is greater than the first threshold voltage.

16. The integrated circuit of claim 15,
wherein the plurality of first nanosheet FETs comprises a plurality of n-type FETs and a respective plurality of p-type FETs to provide a plurality of complementary pairs of nanosheet FETs,
wherein ones of the plurality of n-type FETs comprise a first quantity of horizontal layers of nanosheets, wherein the nanosheets of ones of the plurality of n-type FETs comprise a Group III-V semiconductor,
wherein ones of the plurality of p-type FETs comprise a second quantity of horizontal layers of nanosheets, wherein the nanosheets of ones of the plurality of p-type FETs comprise more than about 70% Ge, and
wherein ones of the second nanosheet FETs comprise a third quantity of horizontal layers of nanosheets, wherein the third quantity is greater than the first quantity, and wherein the third quantity is greater than the second quantity.

17. The integrated circuit of claim 1,
wherein the plurality of first nanosheet FETs comprises a plurality of n-type FETs and a plurality of p-type FETs,
wherein the nanosheets of ones of the plurality of n-type FETs comprise InGaAs, and
wherein the nanosheets of ones of the plurality of p-type FETs comprise more than about 70% Ge.

18. The integrated circuit of claim 1,
wherein the plurality of second nanosheet FETs comprises a plurality of n-type FETs and a plurality of p-type FETs,
wherein a surface orientation of top and bottom surfaces of the nanosheets of ones of the plurality of n-type FETs is (100), and
wherein a surface orientation of top and bottom surfaces of the nanosheets of ones of the plurality of p-type nanosheet FETs is (110).

19. The integrated circuit of claim 1,
wherein the nanosheets of the ones of the first nanosheet FETs comprise more than about 70% Ge,
wherein the plurality of first nanosheet FETs comprises a plurality of n-type FETs and a plurality of p-type FETs,
wherein a surface orientation of top and bottom surfaces of the nanosheets of ones of the plurality of n-type FETs is (111), and
wherein a surface orientation of top and bottom surfaces of the nanosheets of ones of the plurality of p-type nanosheet FETs is (110).

20. The integrated circuit of claim 1,
wherein a first thickness of a first subset of the plurality of first nanosheet FETs is different from a second thickness of a second subset of the plurality of first nanosheet FETs, and
wherein a difference between the first thickness and the second thickness is sufficiently large to affect a threshold voltage, $V_T$, a carrier mobility, and an effective drive current of the first plurality of nanosheet FETs.

* * * * *